US012660337B2

(12) United States Patent
Qiu et al.

(10) Patent No.: US 12,660,337 B2
(45) Date of Patent: Jun. 16, 2026

(54) CMOS IMAGE SENSOR WITH A ELECTROTRANSFER STRUCTURE COMPRISING A VERTICAL GATE EXTENDING FROM A TOP SEMICONDUCTOR SUBSTRATE INTO A BOTTOM SEMICONDUCTOR SUBSTRATE OF A SILICON-ON-INSULATOR SUBSTRATE AND METHOD FOR MANUFACTURING SAME

(71) Applicant: Shanghai Huali Microelectronics Corporation, Shanghai (CN)

(72) Inventors: Chenchen Qiu, Shanghai (CN); Jun Qian, Shanghai (CN); Chang Sun, Shanghai (CN); Zhengying Wei, Shanghai (CN)

(73) Assignee: Shaghai Huali Microelectronics Corporation, Shanghai (CN)

( * ) Notice: Subject to any disclaimer, the term of this patent is extended or adjusted under 35 U.S.C. 154(b) by 442 days.

(21) Appl. No.: 18/342,209

(22) Filed: Jun. 27, 2023

(65) Prior Publication Data

US 2024/0153980 A1 May 9, 2024

(30) Foreign Application Priority Data

Nov. 8, 2022 (CN) .......................... 202211390293.X

(51) Int. Cl.
| | |
|---|---|
| *H10F 39/00* | (2025.01) |
| *H04N 25/77* | (2023.01) |
| *H04N 25/79* | (2023.01) |
| *H10F 39/18* | (2025.01) |

(52) U.S. Cl.
CPC ........... *H10F 39/026* (2025.01); *H04N 25/77* (2023.01); *H04N 25/79* (2023.01); *H10F 39/18* (2025.01)

(58) Field of Classification Search
CPC ...... H10F 39/026; H10F 39/18; H10F 39/014; H10F 39/811; H10F 39/80373; H10F 39/802; H10F 39/011; H10F 39/8037; H04N 25/77; H04N 25/79
See application file for complete search history.

(56) References Cited

U.S. PATENT DOCUMENTS

| | | | |
|---|---|---|---|
| 2015/0035028 A1* | 2/2015 | Fan ....................... | H04N 25/616 |
| | | | 257/292 |
| 2018/0033809 A1* | 2/2018 | Tayanaka ............. | H04N 25/583 |
| 2020/0105812 A1* | 4/2020 | Sze ........................ | H10F 39/199 |

(Continued)

*Primary Examiner* — William B Partridge
*Assistant Examiner* — Ilker Ozden
(74) *Attorney, Agent, or Firm* — Quarles & Brady LLP

(57) ABSTRACT

The present application discloses a CMOS image sensor. A pixel cell circuit comprises a photodiode and a CMOS pixel readout circuit. The pixel cell circuit is formed on an SOI substrate, and the photodiode is formed on a bottom semiconductor substrate. The CMOS pixel readout circuit is formed on a top semiconductor substrate. A photo-induced carrier of the photodiode is connected to the CMOS pixel readout circuit by means of an electrotransfer structure passing through a dielectric buried layer. The present application also discloses a method for manufacturing a CMOS image sensor. The present application can increase a pixel cell density without reducing a photodiode area, thus achieving an ultra-high CMOS image sensor density and improving the device quality.

11 Claims, 2 Drawing Sheets

(56)          References Cited

U.S. PATENT DOCUMENTS

| | | | | |
|---|---|---|---|---|
| 2020/0266229 | A1* | 8/2020 | Takahashi | H10F 39/018 |
| 2021/0320139 | A1* | 10/2021 | Sze | H10F 39/026 |
| 2022/0271070 | A1* | 8/2022 | Nakazawa | H04N 25/778 |
| 2022/0367540 | A1* | 11/2022 | Saka | H10F 39/80373 |
| 2024/0006452 | A1* | 1/2024 | Maeda | H10F 39/8037 |
| 2024/0047501 | A1* | 2/2024 | Shim | H10F 39/18 |

\* cited by examiner

CMOS IMAGE SENSOR WITH A ELECTROTRANSFER STRUCTURE COMPRISING A VERTICAL GATE EXTENDING FROM A TOP SEMICONDUCTOR SUBSTRATE INTO A BOTTOM SEMICONDUCTOR SUBSTRATE OF A SILICON-ON-INSULATOR SUBSTRATE AND METHOD FOR MANUFACTURING SAME

CROSS-REFERENCES TO RELATED APPLICATIONS

This application claims the priority to Chinese patent application No. CN 202211390293.X, filed on Nov. 8, 2022, and entitled "CMOS IMAGE SENSOR AND METHOD FOR MANUFACTURING SAME", the disclosure of which is incorporated herein by reference in entirety.

TECHNICAL FIELD

The present application relates to the field of manufacturing semiconductor integrated circuits, in particular to a CMOS image sensor. The present application also relates to a method for manufacturing a CMOS image sensor.

BACKGROUND

An existing CMOS image sensor (CIS) is composed of a pixel cell circuit and a CMOS circuit. Compared with a CCD image sensor, the CMOS image sensor has a higher integration degree due to the use of a CMOS standard manufacturing process, can be integrated with other digital-analog operation and control circuits on the same chip, and thus is more applicable to future development.

According to the number of transistors included in the pixel cell circuit of the existing CMOS image sensor, the existing CMOS image sensors are mainly classified into a 3T-type structure and a 4T-type structure.

FIG. 1 is a schematic diagram of an equivalent circuit of a pixel cell circuit of an existing 3T-type CMOS image sensor. The pixel cell circuit of the existing 3T-type CMOS image sensor includes a photodiode (PD) D1 and a CMOS pixel readout circuit. The CMOS pixel readout circuit is a 3T-type pixel circuit, including a reset transistor (RST) M1, an amplification transistor (SF) M2, and a selection transistor (RS) M3, all of which are NMOS transistors.

An N-type region of the photodiode D1 is connected to the source of the reset transistor M1.

The gate of the reset transistor M1 is connected to a reset signal Reset, and the reset signal Reset is a potential pulse. When the reset signal Reset is at a high level, the reset transistor M1 is turned on and absorbs electrons of the photodiode D1 into a power supply Vdd of the readout circuit, so as to achieve reset. The photodiode D1, when irradiated by light, generates photo-induced electrons, the potential increases, and an electrical signal is transmitted via an amplification circuit. The gate of the selection transistor M3 is connected to a row selection signal Rs, so as to select an amplified electrical signal for output, i.e., an output signal Vout.

FIG. 2 is a schematic diagram of an equivalent circuit of a pixel cell circuit of an existing 4T-type CMOS image sensor. The structure shown in FIG. 2 differs from the structure shown in FIG. 1 in terms of an additional transfer transistor, which is also referred to as a transmission transistor M4. A source region of the transfer transistor M4 is an N-type region connected to the photodiode D1, a drain region of the transfer transistor M4 is a floating diffusion (FD) region, and the gate of the transfer transistor M4 is connected to a transmission control signal Tx. The photo-induced electrons, after generated by the photodiode D1, are transferred into the floating diffusion region via the transfer transistor M4, and then the floating diffusion region is connected to the gate of the amplification transistor M2 to achieve signal amplification.

Typically, the N-type region of the photodiode D1 is referred to as an NPPD layer. In order to improve the junction depth, the N-type region of the photodiode D1 includes DNPPD, i.e., deep NPPD. DNPPD may include depths of a plurality of deepened N-type regions, e.g., including DNPPD1 and DNPPD2, wherein DNPPD2 is formed in DNPPD1, and DNPPD is formed in DNPPD2. The N-type region of the photodiode D1 is formed in a P-type semiconductor substrate, and PD formed between the N-type region of the photodiode D1 and the bottom P-type semiconductor substrate serves as the photodiode D1. A P+ doped PPPD layer is typically formed on the surface of the NPPD layer, achieving a pinned photodiode structure.

With the increasingly urgent demand of modern people for small-sized and high-resolution chips, increasing the CIS density becomes one of the current development directions. An existing method for increasing the CIS density includes the following:

An ultra-thin stack (UTS) technology is used to peel away a logic device and a pixel-related device to improve the density.

The density can be increased by reducing the PD area to 0.5-0.6 μm. However, the reduction of the PD area causes a series of problems such as full well capacitance, a lag, and a white pixel, thus limiting further reduction of the pixel size.

BRIEF SUMMARY

According to some embodiments in this application, a CMOS image sensor includes a pixel cell circuit, which includes a photodiode and a CMOS pixel readout circuit.

The pixel cell circuit is formed on an SOI substrate, and the SOI substrate includes a bottom semiconductor substrate, a dielectric buried layer, and a top semiconductor substrate.

The photodiode is formed on the bottom semiconductor substrate.

The CMOS pixel readout circuit is formed on the top semiconductor substrate.

A photo-induced carrier of the photodiode is connected to the CMOS pixel readout circuit by means of an electrotransfer structure passing through the dielectric buried layer.

In some cases, the bottom semiconductor substrate is P-type doped.

An N-type region of the photodiode is formed in the bottom semiconductor substrate, and a P-type region of the photodiode includes the P-type doped bottom semiconductor substrate located at the bottom of the N-type region.

In some cases, constituent parts of the electrotransfer structure include a transmission transistor.

A gate structure of the transmission transistor is a vertical gate, and the vertical gate passes through the dielectric buried layer from the top of the top semiconductor substrate and enters the bottom semiconductor substrate.

A drain region of the transmission transistor is also formed on the surface of the bottom semiconductor substrate.

The N-type region of the photodiode serves as a source region of the transmission transistor.

In some cases, a first contact (CT) passing through the dielectric buried layer is formed at the top of the drain region of the transmission transistor, and the constituent parts of the electrotransfer structure further include the first contact.

In some cases, the material of the bottom semiconductor substrate includes silicon.

The material of the top semiconductor substrate includes silicon.

The material of the dielectric buried layer includes an oxide layer.

In some cases, the CMOS pixel readout circuit includes a reset transistor, an amplification transistor, and a selection transistor.

The reset transistor, the amplification transistor, and the selection transistor are all formed on the top semiconductor substrate.

In some cases, the CMOS image sensor further includes a logic circuit, and the logic circuit is also formed on the top semiconductor substrate.

In order to solve the above technical problem, in the method for manufacturing a CMOS image sensor provided by the present application, a pixel cell circuit includes a photodiode and a CMOS pixel readout circuit, and formation steps include:

step 1, providing a bottom semiconductor substrate, wherein the photodiode is formed on the bottom semiconductor substrate;

step 2, sequentially forming a dielectric buried layer and a top semiconductor substrate on the surface of the bottom semiconductor substrate, wherein an SOI substrate includes the bottom semiconductor substrate, the dielectric buried layer, and the top semiconductor substrate;

step 3, forming the CMOS pixel readout circuit on the top semiconductor substrate; and step 4, forming an electrotransfer structure passing through the dielectric buried layer, wherein the electrotransfer structure connects a photo-induced carrier of the photodiode to the CMOS pixel readout circuit.

In some cases, the bottom semiconductor substrate is P-type doped.

An N-type region of the photodiode is formed in the bottom semiconductor substrate by means of ion implantation in step 1, and a P-type region of the photodiode includes the P-type doped bottom semiconductor substrate located at the bottom of the N-type region.

In some cases, constituent parts of the electrotransfer structure include a transmission transistor.

The method further includes a step of performing ion implantation to form a drain region of the transmission transistor on the surface of the bottom semiconductor substrate in step 1; and the N-type region of the photodiode serves as a source region of the transmission transistor.

The method includes forming a gate structure of the transmission transistor in step 4, the gate structure is a vertical gate, and the vertical gate passes through the dielectric buried layer from the top of the top semiconductor substrate and enters the bottom semiconductor substrate. Substeps of forming the vertical gate include:

forming a gate trench, wherein the gate trench passes through the dielectric buried layer from the top of the top semiconductor substrate and enters the bottom semiconductor substrate;

forming a gate dielectric layer on an inner surface of the gate trench; and filling the gate trench with a gate conductive material layer.

In some cases, the constituent parts of the electrotransfer structure further include a first contact.

After forming the gate structure of the transmission transistor in step 4, the method further includes:

forming an interlayer film; and forming the first contact, wherein the first contact passes through the interlayer film, the top semiconductor substrate, and the dielectric buried layer, and the bottom of the first contact is in contact with the drain region of the transmission transistor.

In some cases, the material of the bottom semiconductor substrate includes silicon.

The material of the top semiconductor substrate includes silicon.

The material of the dielectric buried layer includes an oxide layer.

In some cases, the CMOS pixel readout circuit includes a reset transistor, an amplification transistor, and a selection transistor.

The reset transistor, the amplification transistor, and the selection transistor are all formed on the top semiconductor substrate.

In some cases, the CMOS image sensor further includes a logic circuit, and the logic circuit is also formed on the top semiconductor substrate.

In some cases, the SOI substrate is a fully depleted SOI (FD-SOI) substrate.

In the present application, the photodiode is formed on the bottom semiconductor substrate of the SOI substrate, and a transistor matching the pixel cell circuit, i.e., a device of the CMOS pixel readout circuit, is formed on the top semiconductor substrate, such that the size of the photodiode is not affected by the matching transistor, thereby reducing the size of the pixel cell circuit while maintaining or increasing the size of the photodiode, increasing a fill factor (FF), and forming a product having a small pixel size.

In the present application, a large-sized photodiode can increase full well capacitance and improve the problems of a lag and a white pixel. The device of the CMOS pixel readout circuit is formed on the relatively thin top semiconductor substrate, thereby significantly reducing parasitic capacitance of the matching transistor, and achieving a high operation speed, a low electric leakage, and low power consumption. In addition, the bottom semiconductor substrate of the present application serves as a photodiode layer where only a photodiode is prepared with a relatively simple process, the surface of the photodiode is less affected by other processes, and the performance can be adjusted separately, facilitating the improvement of the device performance. Therefore, the present application can achieve a high-performance, small-pixel size, and high-density CIS product.

BRIEF DESCRIPTION OF THE DRAWINGS

The present application will be further described in detail below with reference to the drawings and specific implementations.

DETAILED DESCRIPTION OF THE DISCLOSURE

Figure 1:
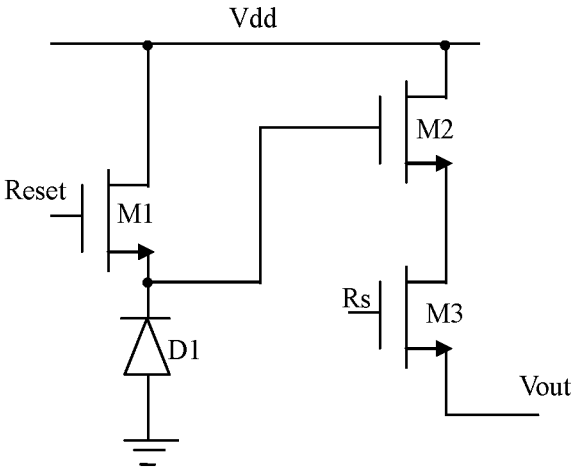
FIG. 1 is a schematic diagram of an equivalent circuit of a pixel cell circuit of an existing 3T-type CMOS image sensor.
Figure 2:
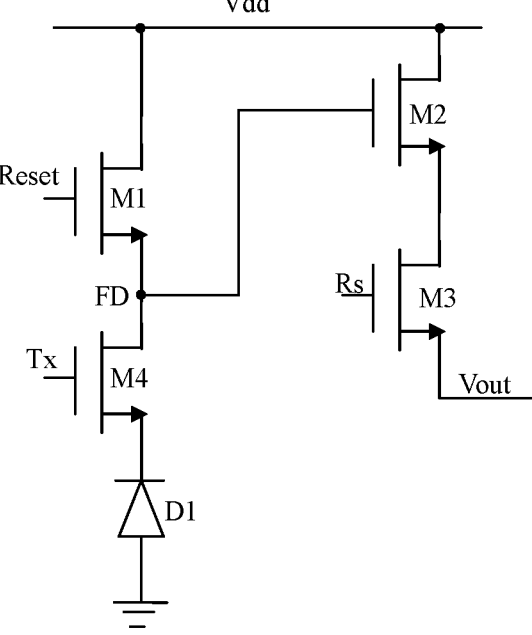
FIG. 2 is a schematic diagram of an equivalent circuit of a pixel cell circuit of an existing 4T-type CMOS image sensor.
Figure 3:
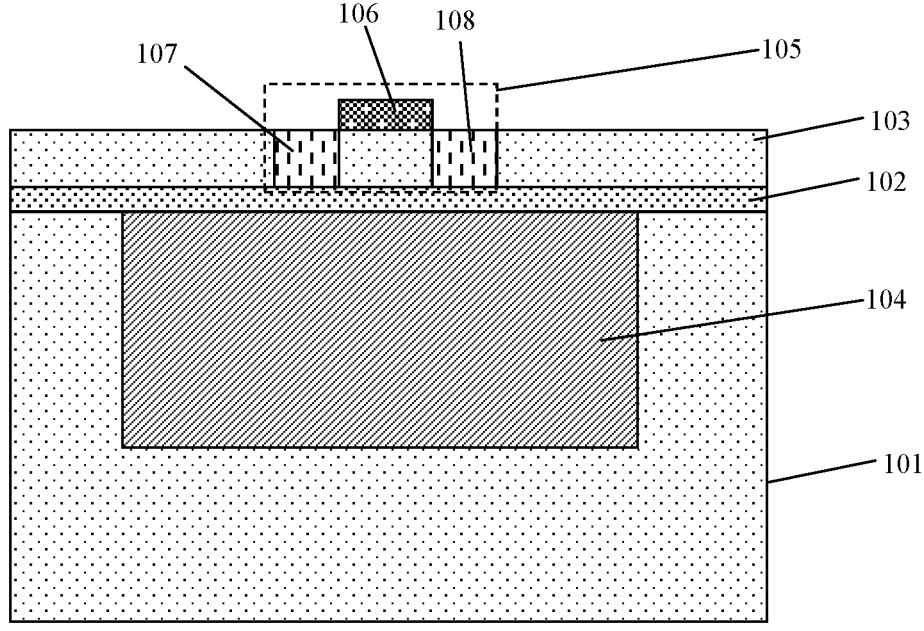
FIG. 3 is a schematic diagram of a structure of a pixel cell circuit of a CMOS image sensor according to an embodiment of the present application.

FIG. 3 is a schematic diagram of a structure of a pixel cell circuit of a CMOS image sensor according to an embodiment of the present application. The pixel cell circuit of the CMOS image sensor in this embodiment of the present application includes a photodiode and a CMOS pixel readout circuit 105. Only one of the photodiodes and only one MOS transistor in the CMOS pixel readout circuit 105 are shown in FIG. 3.

The pixel cell circuit is formed on an SOI substrate, and the SOI substrate includes a bottom semiconductor substrate 101, a dielectric buried layer 102, and a top semiconductor substrate 103.

In this embodiment of the preset application, the material of the bottom semiconductor substrate 101 includes silicon.

The material of the top semiconductor substrate 103 includes silicon.

The material of the dielectric buried layer 102 includes an oxide layer.

The bottom semiconductor substrate 101 is P-type doped.

The photodiode is formed on the bottom semiconductor substrate 101.

In this embodiment of the preset application, an N-type region 104 of the photodiode is formed in the bottom semiconductor substrate 101, and a P-type region of the photodiode includes the P-type doped bottom semiconductor substrate 101 located at the bottom of the N-type region 104.

The CMOS pixel readout circuit 105 is formed on the top semiconductor substrate 103.

The CMOS pixel readout circuit 105 includes a reset transistor, an amplification transistor, and a selection transistor. The reset transistor, the amplification transistor, and the selection transistor are all formed on the top semiconductor substrate 103.

The CMOS image sensor further includes a logic circuit, and the logic circuit is also formed on the top semiconductor substrate 103.

A MOS transistor in the CMOS pixel readout circuit 105 shown FIG. 3 represents one of the reset transistors, the amplification transistor, and the selection transistor. The MOS transistor includes a gate structure 106 and a source region 107 and a drain region 108 formed on two sides of the gate structure 106 in a self-aligned manner. The gate structure 106 includes a gate dielectric layer and a polysilicon gate sequentially formed on the surface of the top semiconductor substrate 103.

A photo-induced carrier of the photodiode is connected to the CMOS pixel readout circuit 105 by means of an electrotransfer structure passing through the dielectric buried layer 102. As can be seen from FIG. 3, in this embodiment of the present application, the MOS transistor of the CMOS pixel readout circuit 105 and the photodiode do not need to be coplanar, thus achieving a longitudinal stack of the photodiode and the CMOS pixel readout circuit 105 in a pixel region, and thereby maintaining a relatively large size of the photodiode while reducing the size of the pixel cell circuit, i.e., the pixel size.

Figure 4:
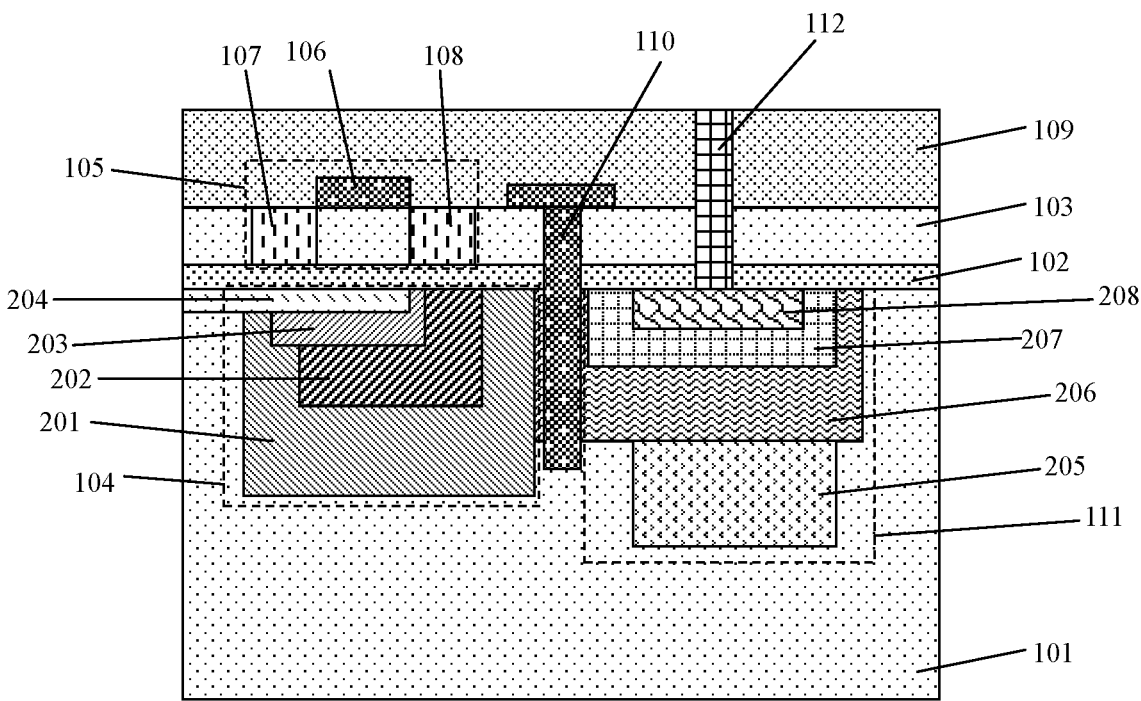
FIG. 4 is a schematic diagram of the structure of the pixel cell circuit of the CMOS image sensor according to a preferred embodiment of the present application.

FIG. 4 is a schematic diagram of the structure of the pixel cell circuit of the CMOS image sensor according to a preferred embodiment of the present application. In the preferred embodiment of the present application, constituent parts of the electrotransfer structure include a transmission transistor.

A gate structure of the transmission transistor is a vertical gate 110, and the vertical gate 110 passes through the dielectric buried layer 102 from the top of the top semiconductor substrate 103 and enters the bottom semiconductor substrate 101.

A drain region 111 of the transmission transistor is also formed on the surface of the bottom semiconductor substrate 101.

The N-type region 104 of the photodiode serves as a source region of the transmission transistor.

The N-type region 104 of the photodiode includes: a DNPPD1 layer 201, a DNPPD2 layer 202, and an NPPD layer 203. A junction depth of the DNPPD1 layer 201 is greater than a junction depth of the DNPPD2 layer 202, and the junction depth of DNPPD2 layer 202 is greater than a junction depth of the NPPD layer 203. A PPPD layer 204 is also formed on the surface of the NPPD layer 203. NPPD represents an N-type implantation region of the photodiode, DNPPD represents an N-type deep implantation region of the photodiode, and PPPD represents a P-type deep implantation region of the photodiode.

The drain region 111 of the transmission transistor includes a DPW layer 205, a CPW layer 206, an NW layer 207, and an SDN layer 208. DPW represents a deep P-well, CPW represents a cell P-well, NW represents an N-well, and SDN represents N-type source drain implantation.

A first contact 112 passing through the dielectric buried layer 102 is formed at the top of the drain region 111 of the transmission transistor, and the constituent parts of the electrotransfer structure further include the first contact 112.

The first contact 112 passes through an interlayer film 109.

In this embodiment of the present application, the photodiode is formed on the bottom semiconductor substrate 101 of the SOI substrate, and a transistor matching the pixel cell circuit, i.e., a device of the CMOS pixel readout circuit, is formed on the top semiconductor substrate 103, such that the size of the photodiode is not affected by the matching transistor, thereby reducing the size of the pixel cell circuit while maintaining or increasing the size of the photodiode, increasing a fill factor, and forming a product having a small pixel size.

In this embodiment of the present application, a large-sized photodiode can increase full well capacitance and improve the problems of a lag and a white pixel. The device of the CMOS pixel readout circuit is formed on the relatively thin top semiconductor substrate 103, thereby significantly reducing parasitic capacitance of the matching transistor, and achieving a high operation speed, a low electric leakage, and low power consumption. In addition, the bottom semiconductor substrate 101 of this embodiment of the present application serves as a photodiode layer where only a photodiode is prepared with a relatively simple process, the surface of the photodiode is less affected by other processes, and the performance can be adjusted separately, facilitating the improvement of the device performance. Therefore, this embodiment of the present application can achieve a high-performance, small-pixel size, and high-density CIS product.

In the method for manufacturing a CMOS image sensor provided by this embodiment of the present application, a pixel cell circuit includes a photodiode and a CMOS pixel readout circuit 105, and formation steps include the following:

Step 1. Referring to FIG. 3, a bottom semiconductor substrate 101 is provided, wherein the photodiode is formed on the bottom semiconductor substrate 101.

In the method of this embodiment of the present application, the material of the bottom semiconductor substrate 101 includes silicon.

The bottom semiconductor substrate 101 is P-type doped.

An N-type region 104 of the photodiode is formed in the bottom semiconductor substrate 101 by means of ion implantation, and a P-type region of the photodiode includes the P-type doped bottom semiconductor substrate 101 located at the bottom of the N-type region 104.

Step 2. Referring to FIG. 3, a dielectric buried layer 102 and a top semiconductor substrate 103 are sequentially formed on the surface of the bottom semiconductor substrate 101, wherein an SOI substrate includes the bottom semiconductor substrate 101, the dielectric buried layer 102, and the top semiconductor substrate 103.

In the method of this embodiment of the present application, the material of the dielectric buried layer 102 includes an oxide layer.

The material of the top semiconductor substrate 103 includes silicon.

In some embodiment, the SOI substrate is a fully depleted SOI substrate.

Step 3. Referring to FIG. 3, the CMOS pixel readout circuit 105 is formed on the top semiconductor substrate 103.

In the method of this embodiment of the present application, the CMOS pixel readout circuit 103 includes a reset transistor, an amplification transistor, and a selection transistor. The reset transistor, the amplification transistor, and the selection transistor are all formed on the top semiconductor substrate 103.

A MOS transistor in the CMOS pixel readout circuit 105 is shown FIG. 3. The MOS transistor represents any one of the reset transistor, the amplification transistor, and the selection transistor. The MOS transistor includes a gate structure 106, a source region 107, and a drain region 108.

The CMOS image sensor further includes a logic circuit, and the logic circuit is also formed on the top semiconductor substrate 103.

Step 4. An electrotransfer structure passing through the dielectric buried layer 102 is formed, wherein the electrotransfer structure connects a photo-induced carrier of the photodiode to the CMOS pixel readout circuit 105.

In the method for manufacturing a CMOS image sensor of the preferred embodiment of the present application as shown in FIG. 4, constituent parts of the electrotransfer structure include a transmission transistor.

The method further includes a step of performing ion implantation to form a drain region 111 of the transmission transistor on the surface of the bottom semiconductor substrate 101 in step 1. The N-type region 104 of the photodiode serves as a source region of the transmission transistor.

The N-type region 104 of the photodiode includes: a DNPPD1 layer 201, a DNPPD2 layer 202, and an NPPD layer 203. A junction depth of the DNPPD1 layer 201 is greater than a junction depth of the DNPPD2 layer 202, and the junction depth of the DNPPD2 layer 202 is greater than a junction depth of the NPPD layer 203. A PPPD layer 204 is also formed on the surface of the NPPD layer 203. NPPD represents an N-type implantation region of the photodiode, DNPPD represents an N-type deep implantation region of the photodiode, and PPPD represents a P-type deep implantation region of the photodiode.

The drain region 111 of the transmission transistor includes a DPW layer 205, a CPW layer 206, an NW layer 207, and an SDN layer 208. DPW represents a deep P-well, CPW represents a cell P-well, NW represents an N-well, and SDN represents N-type source drain implantation.

The method includes forming a gate structure of the transmission transistor in step 4, the gate structure is a vertical gate 110, and the vertical gate 110 passes through the dielectric buried layer 102 from the top of the top semiconductor substrate 103 and enters the bottom semiconductor substrate 101. Substeps of forming the vertical gate 110 include the following:

A gate trench is formed, wherein the gate trench passes through the dielectric buried layer 102 from the top of the top semiconductor substrate 103 and enters the bottom semiconductor substrate 101.

A gate dielectric layer is formed on an inner surface of the gate trench.

The gate trench is filled with a gate conductive material layer.

The gate dielectric layer of the vertical gate 110 and a gate dielectric layer of the gate structure 106 of the MOS transistor can be formed simultaneously. In some embodiments, the gate dielectric layer is a gate oxide layer formed by means of a thermal oxidation process. The gate conductive material layer of the vertical gate 110 and a gate conductive material layer of the gate structure 106 of the MOS transistor can be formed simultaneously. In some embodiments, the gate conductive material layer is a polysilicon gate.

The constituent parts of the electrotransfer structure further include a first contact 112. After forming the gate structure of the transmission transistor in step 4, the method further includes the following:

An interlayer film 109 is formed.

The first contact 112 is formed, wherein the first contact 112 passes through the interlayer film 109, the top semiconductor substrate 103, and the dielectric buried layer 102, and the bottom of the first contact 112 is in contact with the drain region 111 of the transmission transistor.

In order to solve the current problem of increasing the pixel size of a CIS product without an increase in a chip size and without a sacrifice of a PD size, in this embodiment of the present application, SF, RST, and RS cells matching a pixel cell are moved to an FDSOI layer, i.e., the top semiconductor layer. Since a PD layer includes only a photodiode, FF can be maximized, thus increasing the density. That is, this embodiment of the present application can prepare a small-pixel size product by increasing the FF without reducing a PD area, thereby improving the resolution.

Since the PD layer includes only a photodiode prepared with a relatively simple process, the surface of the PD is less affected by other processes, and the performance can be adjusted separately, a high-performance, small-pixel size, and high-density CIS product can be prepared.

In the method of this embodiment of the present application, N-type and P-type implantation is performed on a P-type epitaxial (epi) wafer to form the PD, then an ultra-thin buried oxide layer is grown thereon, and matching transistors including RST, SF, and RS, and other logic circuits etc. are grown on the top semiconductor substrate on an insulator, i.e., the ultra-thin buried oxide layer, by means of an FDSOI technology, thereby significantly reducing parasitic capacitance of the matching transistor, and achieving a high operation speed, a low electric leakage, and low power consumption. Regarding the gate structure of the transmission transistor (transfer gate), a vertical gate (VTG) technology is used to extend polysilicon (poly) into the PD layer, and an electron is directed from the PD layer to an FDSOI layer, i.e., the top semiconductor substrate, by means of the contact CT.

This embodiment of the present application is applicable to ultra-small pixel image sensors for consumer electronics having a pixel size<0.8 μm.

The present application is described in detail above via specific embodiments, but these embodiments are not intended to limit the present application. Without departing from the principle of the present application, those skilled in the art can still make many variations and improvements, which should also be construed as falling into the protection scope of the present application.

What is claimed is:

1. A CMOS image sensor, wherein a pixel cell circuit comprises a photodiode and a CMOS pixel readout circuit;
 the pixel cell circuit is formed on an SOI substrate, and the SOI substrate comprises a bottom semiconductor substrate, a dielectric buried layer, and a top semiconductor substrate;
 the photodiode is formed on the bottom semiconductor substrate;
 the CMOS pixel readout circuit is formed on the top semiconductor substrate; and
 a photo-induced carrier of the photodiode is connected to the CMOS pixel readout circuit by means of an electrotransfer structure passing through the dielectric buried layer;
 wherein the bottom semiconductor substrate is P-type doped; and
 an N-type region of the photodiode is formed in the bottom semiconductor substrate, and a P-type region of the photodiode comprises the P-type doped bottom semiconductor substrate located at the bottom of the N-type region;
 wherein constituent parts of the electrotransfer structure comprise a transmission transistor;
 a gate structure of the transmission transistor is a vertical gate, and the vertical gate passes through the dielectric buried layer from the top of the top semiconductor substrate and enters the bottom semiconductor substrate;
 a drain region of the transmission transistor is also formed on the surface of the bottom semiconductor substrate; and
 the N-type region of the photodiode serves as a source region of the transmission transistor.

2. The CMOS image sensor according to claim 1, wherein a first contact passing through the dielectric buried layer is formed at the top of the drain region of the transmission transistor, and the constituent parts of the electrotransfer structure further comprise the first contact.

3. The CMOS image sensor according to claim 1, wherein the material of the bottom semiconductor substrate comprises silicon;
 the material of the top semiconductor substrate comprises silicon; and
 the material of the dielectric buried layer comprises an oxide layer.

4. The CMOS image sensor according to claim 1, wherein the CMOS pixel readout circuit comprises a reset transistor, an amplification transistor, and a selection transistor; and the reset transistor, the amplification transistor, and the selection transistor are all formed on the top semiconductor substrate.

5. The CMOS image sensor according to claim 4, wherein the CMOS image sensor further comprises a logic circuit, and the logic circuit is also formed on the top semiconductor substrate.

6. A method for manufacturing a CMOS image sensor, wherein a pixel cell circuit comprises a photodiode and a CMOS pixel readout circuit, and formation steps comprise:
 step 1, providing a bottom semiconductor substrate, wherein the photodiode is formed on the bottom semiconductor substrate;
 step 2, sequentially forming a dielectric buried layer and a top semiconductor substrate on the surface of the bottom semiconductor substrate, wherein an SOI substrate comprises the bottom semiconductor substrate, the dielectric buried layer, and the top semiconductor substrate;
 step 3, forming the CMOS pixel readout circuit on the top semiconductor substrate; and
 step 4, forming an electrotransfer structure passing through the dielectric buried layer, wherein the electrotransfer structure connects a photo-induced carrier of the photodiode to the CMOS pixel readout circuit;
 wherein the bottom semiconductor substrate is P-type doped; and
 an N-type region of the photodiode is formed in the bottom semiconductor substrate by means of ion implantation in step 1, and a P-type region of the photodiode comprises the P-type doped bottom semiconductor substrate located at the bottom of the N-type region;
 wherein constituent parts of the electrotransfer structure comprise a transmission transistor;
 the method further comprises a step of performing ion implantation to form a drain region of the transmission transistor on the surface of the bottom semiconductor substrate in step 1; the N-type region of the photodiode serves as a source region of the transmission transistor;
 the method comprises forming a gate structure of the transmission transistor in step 4, the gate structure is a vertical gate, and the vertical gate passes through the dielectric buried layer from the top of the top semiconductor substrate and enters the bottom semiconductor substrate; and substeps of forming the vertical gate comprise:
 forming a gate trench, wherein the gate trench passes through the dielectric buried layer from the top of the top semiconductor substrate and enters the bottom semiconductor substrate;
 forming a gate dielectric layer on an inner surface of the gate trench; and
 filling the gate trench with a gate conductive material layer.

7. The method for manufacturing a CMOS image sensor according to claim 6, wherein the constituent parts of the electrotransfer structure further comprise a first contact; and
 after forming the gate structure of the transmission transistor in step 4, the method further comprises:
 forming an interlayer film; and
 forming the first contact, wherein the first contact passes through the interlayer film, the top semiconductor substrate, and the dielectric buried layer, and the bottom of the first contact is in contact with the drain region of the transmission transistor.

8. The method for manufacturing a CMOS image sensor according to claim 6, wherein the material of the bottom semiconductor substrate comprises silicon;

the material of the top semiconductor substrate comprises silicon; and the material of the dielectric buried layer comprises an oxide layer.

9. The method for manufacturing a CMOS image sensor according to claim 6, wherein the CMOS pixel readout circuit comprises a reset transistor, an amplification transistor, and a selection transistor; and the reset transistor, the amplification transistor, and the selection transistor are all formed on the top semiconductor substrate.

10. The method for manufacturing a CMOS image sensor according to claim 9, wherein the CMOS image sensor further comprises a logic circuit, and the logic circuit is also formed on the top semiconductor substrate.

11. The method for manufacturing a CMOS image sensor according to claim 6 or 8, wherein the SOI substrate is a fully depleted SOI substrate.

\*    \*    \*    \*    \*